United States Patent [19]

Mara et al.

[11] 4,241,373

[45] Dec. 23, 1980

[54] SWITCHGEAR VOLTAGE SENSOR

[75] Inventors: Eugene G. Mara, Oak Creek; John A. Schreiber, Hartland; William N. LeCourt, Milwaukee, all of Wis.

[73] Assignee: McGraw-Edison Company, Rolling Meadows, Ill.

[21] Appl. No.: 25,500

[22] Filed: Mar. 30, 1979

[51] Int. Cl.³ .................... G01R 15/04; G01R 5/00
[52] U.S. Cl. ................................ 361/92; 361/6; 361/187; 324/126; 324/133
[58] Field of Search .............. 361/6, 7, 92; 324/126, 324/127, 133; 174/142, 143; 340/662, 663

[56] References Cited

U.S. PATENT DOCUMENTS

| | | | |
|---|---|---|---|
| 3,001,100 | 9/1961 | Schuh et al. | 361/92 |
| 3,524,133 | 8/1970 | Arndt | 324/102 |
| 3,932,810 | 1/1976 | Kohler et al. | 324/126 |
| 3,970,932 | 7/1976 | Harvey | 324/133 |
| 3,991,367 | 11/1976 | Chapman et al. | 324/133 |
| 3,999,087 | 12/1976 | Compton | 307/295 |
| 4,052,668 | 10/1977 | Schmitt et al. | 324/126 |
| 4,074,193 | 2/1978 | Kohler | 324/126 |
| 4,121,154 | 10/1978 | Keating | 324/126 |
| 4,124,790 | 11/1978 | Kumbera et al. | 200/144 |

FOREIGN PATENT DOCUMENTS

| | | | |
|---|---|---|---|
| 2516853 | 11/1975 | Fed. Rep. of Germany | 324/126 |
| 371938 | 5/1932 | United Kingdom | 324/126 |

OTHER PUBLICATIONS

Maddox, "High Input Impedance Capacitance Coupled Voltage Probes," *Technical Digest*, Western Electric, No. 45, Jan. 1977, pp. 27–29.

Fletcher, "Overvoltage Counter for Distribution Lines," *Proc. IEE*, vol. 124, No. 6, Jun. 1977, pp. 565–566.

*Primary Examiner*—Harry E. Moose, Jr.
*Assistant Examiner*—L. C. Schroeder
*Attorney, Agent, or Firm*—Jon Carl Gealow; Ronald J. LaPorte

[57] ABSTRACT

A switchgear assembly which includes a vacuum interrupter, a current transformer, and a capacitive voltage sensor, all embedded within a cast epoxy housing mounted to a solidly grounded support structure. The voltage sensor includes a first capacitor, which is formed by an interrupter conductor stud, a plate, and the cast epoxy disposed therebetween, and a second capacitor, which is connected between the plate and a metal tube extending outside the housing. The tube is connected to ground through a conductive coating, applied to the housing, having an impedance which is very low in comparison to the impedance of the first capacitor. The voltage signal on the plate, which is proportional to the stud voltage, is supplied through the center conductor of a coaxial lead to one input of a voltage level sensing circuit, where it is amplified, rectified, and compared with a reference voltage to produce a positive output signal whenever the stud voltage exceeds a first value, and thereafter produce a negative output signal whenever the stud voltage decreases to less than a second value lower than the first value. The conductive shield of the coaxial lead has a first end connected to the metal tube and a second end connected to the ground terminal of the voltage level sensing circuit and to ground through a ground path having a low impedance in comparison to the impedance of conductive coating ground path between the metal tube and the grounded support structure.

26 Claims, 7 Drawing Figures

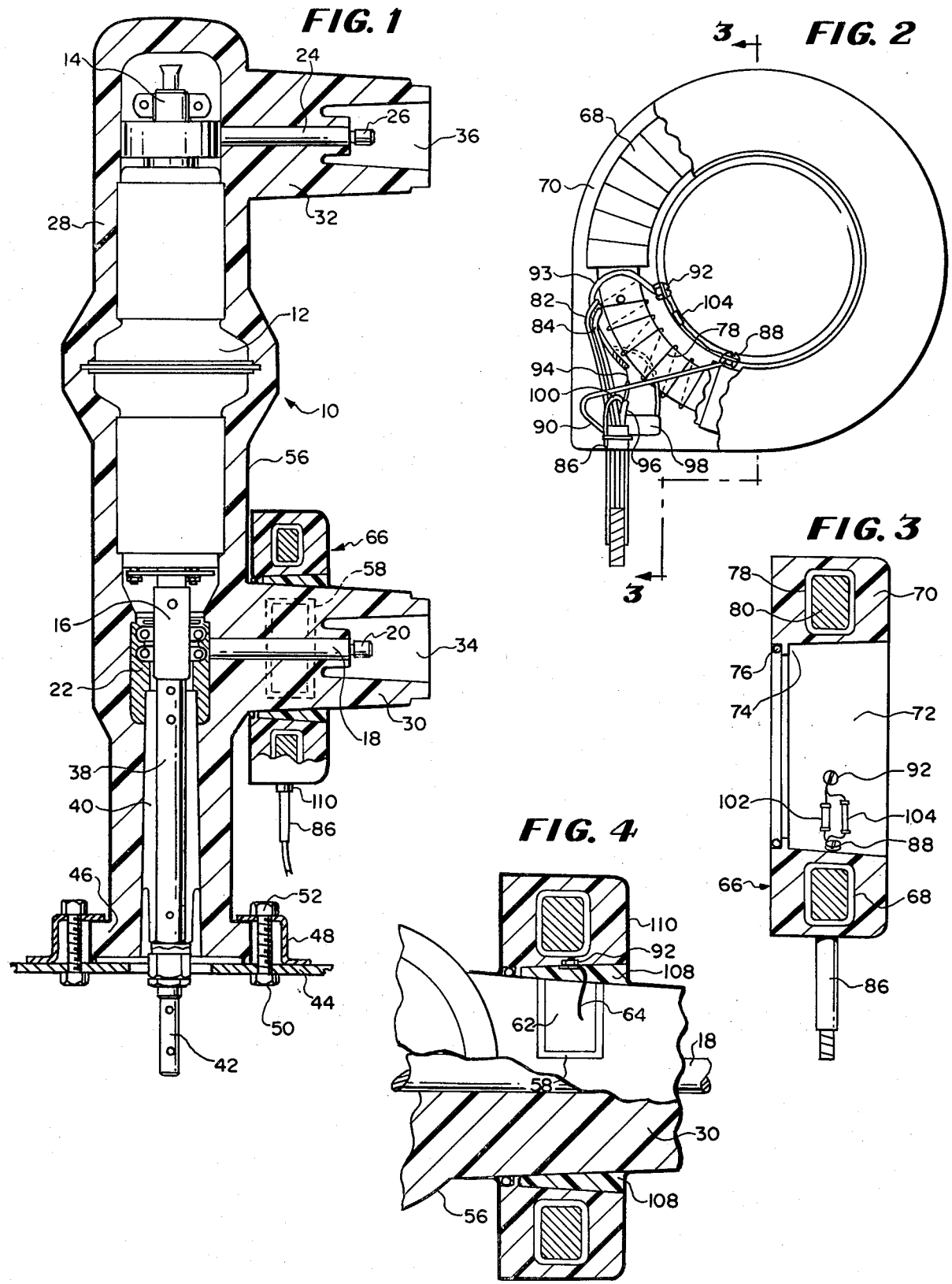

SWITCHGEAR VOLTAGE SENSOR

BACKGROUND OF THE INVENTION

1. Field of the Invention

The invention relates to a voltage measuring device for a high voltage alternating electric system, and more specifically, to a voltage measuring device of the capacitive voltage divider type for switchgear in which a voltage sensor is mounted integrally with the switchgear.

2. Description of the Prior Art

Generally, high voltage switchgear for alternating power systems include operating and control elements, such as motors, relays, and indicating lamps, which are connected between a low voltage AC or DC source and ground. When a capacitive type voltage sensor is integrally mounted to the high voltage switchgear, it is usually connected to a remote signal processing circuit located in a low voltage control compartment of the switchgear cubicle, or in the case of a pole mounted circuit interrupter, in a separate, low voltage control cabinet. Consequently, current flow through the switchgear operating and control elements can induce noise current in the conductors connecting the voltage sensor to the signal processing circuit and adversely affect the accuracy of the signal supplied to the signal processing circuit.

U.S. Pat. No. 3,970,932, to Harvey, discloses a hot line detection system for switchgear in which a high voltage conductor and a cylindrical electrode concentrically spaced about the high voltage conductor are embedded in an epoxy housing, which is mounted within a switchgear cubicle. The cylindrical electrode is connected through a ballast resistor and a neon lamp on the front panel of the switchgear cubicle to ground. When the high voltage conductor is energized, the cylindrical electrode is capacitively coupled to the energized line, to provide sufficient energy to light the neon lamp.

There is no discussion in U.S. Pat. No. 3,970,932, concerning any detrimental effect on the voltage signal supplied by the cylindrical electrode caused by current flow through the switchgear operating or control elements. Since this hot line detection device is only used to indicate whether or not a high voltage line is energized, the effect of any induced noise current may be of no practical significance.

U.S. Pat. No. 4,074,193, to Kohler, discloses a combined current and voltage measuring apparatus which includes a rod-shaped primary conductor and a cylindrical electrode spaced about the primary conductor, which are embedded in a cast resin body. The primary conductor and the cylindrical electrode form a first capacitor, with the portion of the cast resin between the primary conductor and the cylindrical electrode serving as the dielectric of the first capacitor. The cylindrical electrode is connected to ground through a second capacitor which is located outside of the cast resin housing. The voltage across the second capacitor, which is proportional to the voltage between the primary conductor and ground, is amplified and supplied to a voltmeter. There is no discussion in this patent concerning how the voltage measuring apparatus disclosed therein can be used with high voltage switchgear wherein the effect of noise currents induced by switchgear operating and control elements is minimized.

SUMMARY OF THE INVENTION

The present invention includes an encapsulated single phase vacuum interrupter assembly similar to that disclosed in the U.S. Pat. No. 4,124,790, granted to Kumbera et al on Nov. 7, 1978. The interrupter assembly includes a vacuum interrupter which is encapsulated in a central portion of a cast, electrically insulating, epoxy housing. The vacuum interrupter has a fixed contact rod extending from one end of a vacuum enclosure and a movable contact rod extending from an opposite end of the vacuum enclosure, through a tubular portion of the epoxy housing, to an insulating rod connected to the operating mechanism for the vacuum interrupter.

The epoxy housing includes two end portions, each extending from the central housing portion and each having a free end which defines a receiving bushing member, which may be either an apparatus bushing of the type described in the American National Standard ANSI C119, 2-1974, entitled SEPARABLE INSULATED CONNECTORS, or a bushing well of the type described in the above-referenced U.S. Pat. No. 4,124,790. One end portion is cast about a connector stud which has one end attached to the fixed contact rod and an opposite end which extends through one receiving bushing member. The other interrupter housing end portion is cast about a second connector stud, which has one end carrying a current exchange assembly which extends about, and is held in sliding contact with, the movable contact rod. The opposite end of the second connector stud extends through the other receiving bushing member.

The free end of the interrupter housing tubular portion includes an integrally formed mounting flange. The interrupter assembly is mounted to a solidly grounded metal support structure by a metal collar member which abuts against the inner surface of the housing mounting flange to hold the outer surface of the flange against the grounded support structure.

Except for a curved rectangular portion on one or both of the end portions of the interrupter housing, the entire outer surface of the interrupter housing intermediate the two receiving bushing members is covered with a conductive coating, which is connected to ground at the interrupter housing mounting flange.

A curved rectangular voltage sensing plate is affixed to the uncoated portion of the outer periphery of one of the interrupter housing end portions. The conductor stud embedded in the interrupter housing end portion and the voltage sensing plate form a first capacitor, with the portion of the cast epoxy housing disposed between the conductor stud and the voltage sensing plate serving as the dielectric of the first capacitor.

An annular-shaped current transformer, which is encapsulated within a annular-shaped housing of cast electrically insulating epoxy, includes insulated secondary winding leads which extend out of the annular shaped-housing for connection to the control circuit of the vacuum interrupter.

A second capacitor, which is also embedded in the annular-shaped housing, has one terminal lead connected to a conductive member, such as a metal tube, which extends through the outer periphery of the annular-shaped housing, and an opposite terminal lead which is connected to a voltage sensing terminal at the inner periphery of the annular-shaped housing. The conductive member is also connected to a ground terminal, which is disposed at the inner periphery of the annular-shaped housing and spaced from the voltage sensing terminal. A thermistor and a resistor, disposed within the center opening of the annular-shaped housing, are connected electrically in parallel between the voltage sensing terminal and the ground terminal.

The annular-shaped housing is positioned about the interrupter housing end portion so that the thermistor is positioned adjacent a center portion of the voltage sensing plate. The voltage sensing plate is then attached to the voltage sensing terminal of the annular-shaped housing by a braided lead, and the entire annular space between the interrupter housing end portion and the annular-shaped housing is filled with cast, electrically insulating epoxy to form a single switchgear housing.

The annular-shaped housing also includes a coaxial lead, having a center conductor connected to the voltage sensing terminal and an outer conductive shield connected to the conductive member. The coaxial lead includes a free end portion which extends through the outer periphery of the annular housing.

After the annular-shaped housing has been affixed to the interrupter housing, another conductive coating is applied to the external surfaces of the annular-shaped housing, to adjacent portions of the conductive coating on the external surface of the interrupter housing end portion, and to the adjacent surface of the conductive member.

The thermistor and the resistor serve as a temperature compensating network to compensate for temperature-induced changes in the dielectric properties of the cast epoxy which is disposed between the voltage sensing plate and the connector stud, and which serves as the dielectric of the first capacitor. The conductive member extending from the annular-shaped housing is connected to the solidly grounded support structure by a resistive current path through the conductive coatings supplied to the external surfaces of the annular-shaped housing and the interrupter housing. The resistive path to ground has a very low impedance relative to the impedance of the second capacitor at the operating frequency of the alternating electric power system. The connector rod is thus connected to ground through the first capacitor, the second capacitor, and the resistive current path between the second capacitor and the solidly grounded support structure.

A single phase voltage sensing circuit is connected to receive the alternating voltage signal appearing across the second capacitor, which is proportional to the phase-to-ground voltage of one phase of the high voltage alternating power system connected to the connector stud. A first input of the single phase voltage sensing circuit is connected to the center conductor of the coaxial lead and a second input is connected to the adjacent end of the outer conductive shield of the coaxial cable, which is also connected to ground through a current path having a very low impedance relative to the impedance of the resistive current path between the interrupter end of the outer conductive shield and ground.

The signal supplied to the single phase voltage sensing circuit is amplified and rectified by conventional operational amplifiers to produce a positive polarity direct voltage signal proportional to an absolute value of the phase-to-ground voltage of the alternating power system, which is supplied through an input resistor to the non-inverting input of an operational amplifier connected as a signal comparator with hysteresis. The inverting input of the signal comparator amplifier is connected to receive a positive polarity, constant level, direct voltage reference signal from a DC power supply, and the non-inverting input of the signal comparator amplifier is connected through a feedback resistor to the signal comparator amplifier output to thus provide hysteresis in the switching operation of the signal comparator amplifier. The output signal produced by the signal comparator amplifier is switched between a negative polarity direct voltage level and a positive polarity direct voltage level whenever the phase-to-ground voltage of the alternating system exceeds a first predetermined value, and, thereafter, is switched back to the negative polarity voltage level whenever the phase-to-ground voltage of the alternating system decreases to less than a second predetermined value which is less than the first predetermined value of the phase-to-ground voltage. The output signal of the single phase voltage sensing circuit can be used to actuate an electronic switching means, such as a power transistor, which is used to energize or deenergize a relay in the control circuit of the vacuum interrupter.

Three encapsulated single phase circuit interrupter assemblies, connected to three single phase voltage sensing circuits respectively, may be mounted to a common grounded support structure, and connected to a common operating mechanism for use as a three phase circuit interrupter. In one embodiment of the invention, the output signals of the three voltage level sensing circuits are connected through an AND logic circuit and a switching amplifier to energize a control relay only when all three phase-to-ground voltages of the alternating electric system exceeds the first predetermined value. In another embodiment of the invention, the output signals of the three voltage level sensing circuits are connected through an OR logic circuit and a switching amplifier to energize a control relay when any one of the three phase-to-ground voltages of the electric power system exceeds the first predetermined value.

BRIEF DESCRIPTION OF THE DRAWINGS

FIG. 1 is a side view of an encapsulated vacuum interrupter assembly according to the invention, in which the interrupter housing is shown in cross section and the encapsulated current transformer and voltage sensor assembly in shown partly in cross section.

FIG. 2 is an end view of the encapsulated current transformer and voltage sensor assembly, according to the invention, which has portions of the cast epoxy housing removed.

FIG. 3 is a cross sectional view of the encapsulated current transformer and voltage sensor assembly shown in FIG. 2, taken along the line 3—3 of FIG. 2.

FIG. 4 is the bottom view showing the portion of the interrupter housing on which the encapsulated current transformer and voltage sensor assembly is mounted, with the encapsulated current transformer and voltage sensor assembly shown in cross section and portions of the interrupter housing removed.

DESCRIPTION OF THE PREFERRED EMBODIMENTS

Figure 5:
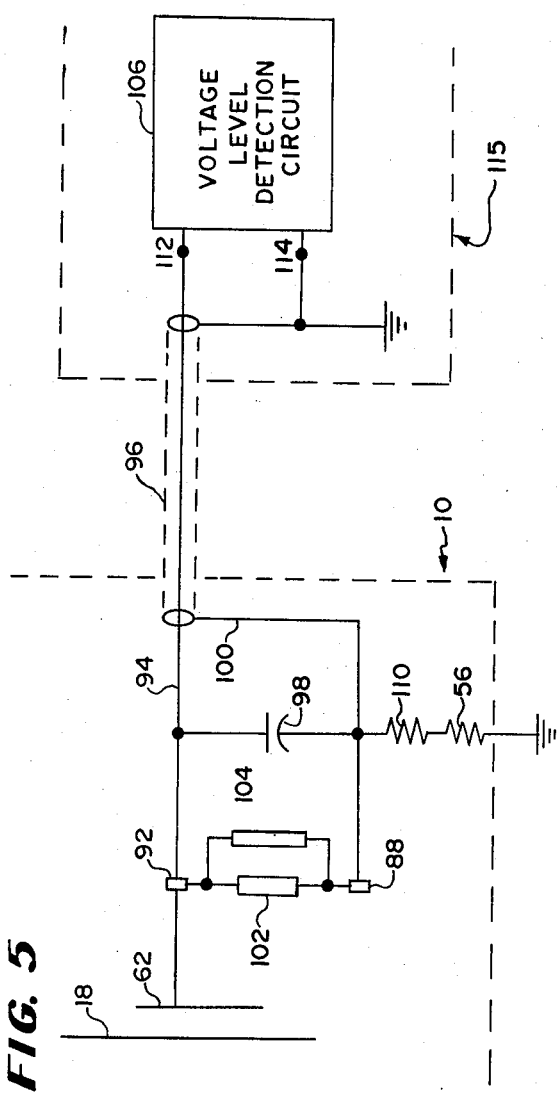
FIG. 5 is an electrical schematic diagram of the encapsulated voltage sensor and the single phase voltage level sensing circuit, according to the invention.

An encapsulated vacuum interrupter assembly 10, similar to that disclosed in the above-referenced U.S. Pat. No. 4,124,790, is shown in FIG. 1. The encapsulated vacuum interrupter assembly 10 includes a vacuum interrupter 12 having a stationary, or fixed, contact rod 14 extending through one end of the vacuum enclosure and a movable contact rod 16 extending through an opposite end of the vacuum enclosure. The movable contact rod 16 is movable along its axis between an open position and a closed position. The adjacent ends of the fixed contact rod 14 and the movable contact rod 16 carry respective contacts which abut against each other when the movable contact rod 16 is in its closed position, and which are separated by a suitable distance when the movable contact rod 16 is in its open position.

A connector stud 18, which extends along an axis orthogonal to the axis of the movable contact rod 16, has an outer threaded end 20. The opposite inner end of the connector stud 18 carries a spring-loaded current exchange assembly 22 which extends about, and is held in sliding contact with, the movable contact rod 16. Another connector stud 24, which extends along an axis orthogonal to the axis of the fixed contact rod 14, has an outer threaded end 26 and an opposite end which is affixed to the fixed contact rod 14.

The encapsulated vacuum interrupter assembly 10 includes an interrupter housing 28 of electrically-insulating cast epoxy. The interrupter housing 28 includes two outwardly projecting end portions 30 and 32 which are cast about the unthreaded portions of the connector studs 18 and 24 respectively. The free ends of the end portions 30 and 32 define bushing wells 34 and 36 respectively, constructed to interphase with standard bushing plug inserts (not shown). Alternatively, the free ends of the end portions 30 and 32 can define switchgear bushings, to which high voltage cable connectors are connected, as described in the U.S. Patent application of Kumbera et al, Ser. No. 836,771, filed Sept. 26, 1977.

An insulating rod 38, which is concentrically disposed in a tubular portion 40 of the interrupter housing 28, is affixed at one end to the movable contact rod 16 and at an opposite end to a connecting rod 42. The connecting rod 42 extends along the axis of the movable contact rod 16 through an opening in a grounded support structure 44 for the encapsulated vacuum interrupter assembly 10 to the operating mechanism (not shown) for the vacuum interrupter 12.

The end of the interrupter housing 28 adjacent the grounded support structure 44 includes an integrally formed mounting flange 46. An encircling, multiple part, metal collar member 48 abuts against an inner side of the flange 46 of the interrupter housing 28. Stud and nut members 50 of the support structure 44 pass through appropriate openings on the collar member 48, and clamping nuts 52 are drawn up tightly to firmly attach the encapsulated vacuum interrupter assembly 10 to the grounded support structure 44.

A conductive coating 56, typically having a resistance in the range of 1000 to 3000 ohms per square, is applied to the entire exterior surface of the interrupter housing 28, except for the end surfaces defining the bushing wells 34 and 36, and an uncoated exterior portion of the end portion 30 which defines a curved rectangular opening or window 58 in the conductive coating 56. A voltage sensing plate 62 of 0.002 inch thick brass strip is affixed by adhesive to the end portion 30 within the window 58. The voltage sensing plate 62 and the connector stud 18 thus form a capacitor, with the portion of the cast epoxy interrupter housing 28 disposed between the voltage sensing plate 62 and the connector stud 18 serving as the dielectric of the capacitor. One end of a tinned, copper wire, braided lead 64 is soldered to the voltage sensing plate 62 for attaching the voltage sensing plate 62 to the encapsulated current transformer and voltage sensor assembly 66, as shown in FIG. 4.

The conductive coating 56 is connected to ground by the metal collar member 48, which is tightly held against the conductive coating 56 on the mounting flange 46 and against the grounded support structure 44.

The encapsulated current transformer and voltage sensor assembly 66 shown in FIGS. 2 and 3, includes a current transformer 68 which is encapsulated within an annular-shaped housing 70 of electrically insulating, cast epoxy. The housing 70 defines a longitudinally tapered opening 72 therethrough of circular cross section. The smallest diameter of this tapered opening 72 is larger than the largest diameter of the end portion 30 adjacent the tubular section of the interrupter housing 28. The housing 70 also defines a flange 74 within the tapered opening 72 near the small end of the opening 72 for holding an O-ring 76 of resilient material which is compressed when the encapsulated current transformer and voltage sensor assembly 66 is mounted about the end portion 30 of the interrupter housing 28.

The current transformer 68 includes a secondary winding 78 which is wound about a core of magnetic material 80. The ends of the current transformer secondary winding 78 are connected to a control circuit for the vacuum interrupter 12 by two insulated electrical leads 82 and 84, which are brought out from the encapsulated current transformer and voltage sensing assembly 66 through an electrically conductive metal tube 86 which is partially embedded in the outer circumference of the epoxy housing 70.

An electrically conductive ground terminal 88, such as a brass nut, is partially embedded in the epoxy housing 70 within the housing opening 72. This ground terminal 88 is connected by a braided conductor lead 90 to the metal tube 86. An electrically conductive voltage sensing terminal 92, similar to the ground terminal 88, is also partially embedded in the epoxy housing 70 within the housing opening 72. The voltage sensing terminal 92 is connected by a braided lead 93 to a center conductor 94 of a coaxial lead 96. The voltage sensing terminal 92 is also connected to one side of a capacitor 98, which is encapsulated within the epoxy housing 70. An opposite side of the capacitor 98 and an outer conductive shield 100 of the coaxial lead 96 is connected to the metal tube 86 within the epoxy housing 70. A resistor 102 and a thermistor 104 are connected in parallel across the ground terminal 88 and the voltage sensing terminal 92 within the opening 72 of the epoxy housing 70. The coaxial lead 96 is brought out of the epoxy housing 70 through the metal tube 86 into a low voltage control compartment and is connected to the inputs of a voltage level sensing circuit 106 described hereinafter.

The encapsulated current transformer and voltage sensor assembly 66 is assembled with, and affixed to the end portion 30 of the interrupter housing 28, as shown in FIGS. 1 and 4. The encapsulated current transformer and voltage sensor assembly 66 is positioned about the interrupter housing end portion 30 so that the resistor 102 and the thermistor 104 is positioned adjacent to a central part of the voltage sensing plate 62. The free end of the lead 64 is then attached to the voltage sensing terminal 92, to connect the voltage sensing terminal 92 to the voltage sensing plate 62. The annular space between the encapsulated current transformer and voltage sensor assembly 66 and the interrupter housing end portion 30 is then completely filled with electrically insulating epoxy 108 similar to the epoxy forming the interrupter housing 28 and the epoxy housing 70. Until cured, the epoxy 108 is retained in the annular space between the encapsulated current transformer and voltage sensor assembly 66 and the interrupter housing end portion 30 by the O-ring 76. After the epoxy 108 has been cured, a conductive coating 110, similar to the conductive coating 56, is applied to the external surfaces of the encapsulated current transformer and voltage sensor assembly 66, to the adjacent portions of the conductive coating 56 on the external surface of the interrupter housing end portion 30 and to the adjacent surface of the metal tube 86.

The conductive coating 110 and the conductive coating 56 which is overlapped by the conductive coating 110, form a resistive current path to ground between the metal tube 86 and the grounded support structure 44. Thus, the capacitor formed by the voltage sensing plate 62 and the connector stud 18 is connected in series with the capacitor 98 and the resistive path formed by the conductive coatings 56 and 110 between the connector stud 18 and ground. Both the resistive path to ground formed by the conductive coatings 56 and 110, and the capacitor 98 have very low impedances, at the operating frequency of the alternating power system, relative to the impedance of the capacitor formed by the voltage sensing plate 62 and the connector stud 18. Typically, the 60 Hz impedance of the parallel combination of the capacitor 98, the resistor 102, and the thermistor 104 is several times the impedance of the resistive path to ground of the conductive coating 56 and 110, and the impedance of the capacitor formed by the voltage sensing plate 62 and the connector stud 18 is greater than the impedance of the capacitor 98 by five or six orders of magnitude. Consequentially, only a very small voltage will appear across the capacitor 98 and the resistive path formed by the conductive coatings 56 and 110 when the connector stud 18 is connected to one phase of a high voltage alternating electric power system, and the voltage appearing across the capacitor 98 will be directly proportional to the phase-to-ground voltage of the power system.

Referring now to FIG. 5, two input terminals 112 and 114 of the voltage level detection circuit 106 are connected across the capacitor 98 by the center conductor 94 and the outer conductive shield 100 of the coaxial lead 96, respectively. The input terminal 114 of the voltage level detection circuit 106 and the adjacent end of the outer conductive shield 100 of the coaxial lead 96 are connected to ground within a low voltage compartment 115 through a current path having a low impedance relative to the impedance of the resistive current path formed by the conductive coatings 56 and 110. Typically, the impedance of the resistive current path through the conductive coatings 56 and 110 is two or three orders of magnitude larger than the low impedance current path to ground within the low voltage control compartment 115. The resistor 102 and the thermistor 104, which are connected across the capacitor 98, serve as a temperature compensating network to compensate for the temperature-induced changes in the dielectric properties of the portion of the epoxy housing 28 disposed between the voltage sensing plate 62 and the connector stud 18. The thermistor 104 is disposed in close proximity to a central portion of the voltage sensing plate 62 in order to sense the temperature of the portion of the epoxy housing 28, serving as dielectric material between the connector stud 18 and the voltage sensing plate 62, as accurately as possible.

The input terminal 114 of the voltage level detection circuit 106 and the adjacent end of the conductive shield 100 of the coaxial lead 96 are connected to ground through a common low impedance path to provide maximum protection against induced noise currents in the signal supplied to the voltage level detection circuit 106 from the capacitor 98. Also, in order to provide open circuit protection of the voltage sensing plate 62 when it is not connected to the voltage level detection circuit 106, it is necessary to ground the side of the capacitor 98 which is connected to the metal tube 86 and the switchgear end of the conductive shield 100. However, if the metal tube 86 were solidly grounded through a low impedance path, the two ends of the conductive shield 100 would be connected in parallel to ground through two low impedance paths, and a significant portion of the current flow through motors, relays, or lamps in the circuit interrupter control circuit would flow to ground through the conductive shield 100 and the solidly grounded metal tube 86. Since any significant flow of current through the conductive shield 100 will induce a noise current in the center conductor 94 and adversely effect the accuracy of the low voltage signal supplied to the voltage level detection circuit 106, the side of the capacitor 98 connected to the conductive shield 100 is connected to ground through the resistive path formed by the conductive coatings 56 and 110, which has a high impedance relative to the low impedance path between the conductive shield 100 and ground within the low voltage control compartment 115. The use of the relatively high impedance ground path formed by the conductive coatings 56 and 110 for the conductive shield 100 at the switchgear end of the coaxial lead 96, prevents the flow of any significant lamp, relay, or motor currents through the conductive shield 100 to ground which would be induced into the center conductor 94 and thus affect the input signal to the voltage level detection circuit 106.

Figure 6:
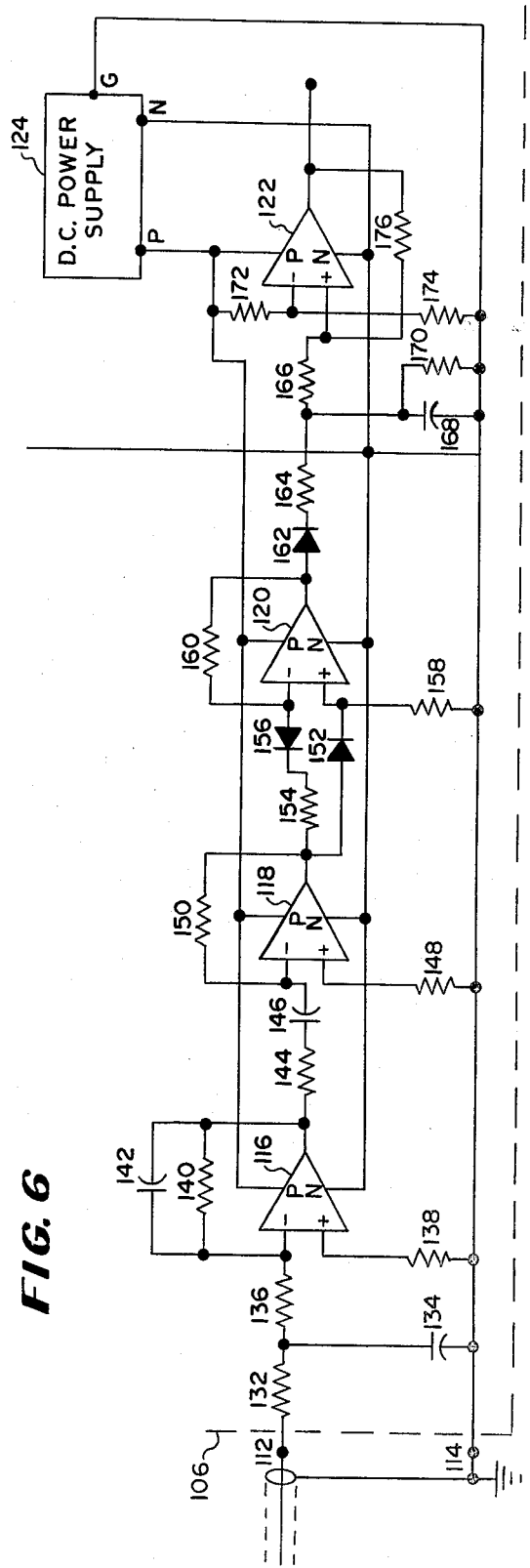
FIG. 6 is a more detailed schematic diagram of the single phase voltage level sensing circuit, according to the invention.

Referring now to FIG. 6, the voltage level detection circuit 106 includes four operational amplifiers 116, 118, 120, and 122, which, in a preferred embodiment of the invention, are included in a single chip, integrated circuit, Device Number LM224, manufactured by the National Semiconductor Corporation, Santa Clara, Calif. Operating power for the operational amplifiers 116, 118, 120, and 122 is supplied from a dual voltge, DC power supply 124. A terminal P of each operational amplifier 116, 118, 120, and 122 is connected to receive a positive polarity, direct voltage signal of approximately 15 volts from a positive output terminal P of the DC power supply 124. Similarly, a terminal N of each operational amplifier 116, 118, 120 and 122 is connected to receive a negative polarity, direct voltage signal of approximately 15 volts from a negative output terminal N of the DC power supply 124. In FIG. 6, the inverting input of each of the operational amplifiers 116, 118, 120 and 122 is indicated by a minus (−) sign, and the non-inverting input of each of the operational amplifiers 116, 118, 120 and 122 is indicated by a plus (+) sign.

The grounded input terminal 114 of the voltage level detection circuit 106 is connected to a ground terminal G of the DC power supply 124. The other input terminal 112 of the voltage level detection circuit 106 is connected through a resistor 132 and a capacitor 134 to ground. The input terminal 112 is also connected through the series combination of the resistor 132 and a resistor 136 to the inverting input of the operational amplifier 116. The non-inverting input of the operational amplifier 116 is connected to ground through a resistor 138. A feedback resistor 140 is connected between the inverting input and the output of the operational amplifier 116. A capacitor 142 is also connected between the inverting input and the output of the operational amplifier 116.

A resistor 144 is connected in series with a capacitor 146 between the output of the operational amplifier 116 and the inverting input of the operational amplifier 118. The non-inverting input of the operational amplifier 118 is connected to ground through a resistor 148. A feedback resistor 150 is connected between the inverting input and the output of the operational amplifier 118.

A diode 152 is connected to allow current flow from the output of the operational amplifier 118 to the non-inverting input of the operational amplifier 120, and to block current flow from the non-inverting input of the operational amplifier 120 to the output of the operational 118. A resistor 154 and a diode 156 are connected in series between the output of the operational amplifier 118 and the inverting input of the operational amplifier 120, to allow current flow from the inverting input of the operational amplifier 120 to the output of the operational amplifier 118, and to block current flow from the output of the operational amplifier 118 to the inverting input of the operational amplifier 120. The non-inverting input of the operational amplifier 120 is connected to ground through a resistor 158 which has the same impedance as the resistor 154. A feedback resistor 160, which has the same impedance as the resistor 154, is connected between the output and the inverting input of the operational amplifier 120. A diode 162, a resistor 164, and a resistor 166 are connected in series between the output of the operational amplifier 120 and the non-inverting input of the operational amplifier 122 to allow current flow from the output of the operational amplifier 120 to the non-inverting input of the operational amplifier 122. A capacitor 168, and a capacitor discharge resistor 170 connected across the capacitor 168, are connected between ground and the juncture of the resistors 164 and 166. The inverting input of the operational amplifier 122 is connected to the positive output terminal P of the DC power supply 124 through a resistor 172. The inverting input of the operational amplifier 122 is also connected to ground through a resistor 174. A feedback resistor 176 is connected between the output and the non-inverting input of the operational amplifier 122.

The operational amplifier 116 is a low pass voltage amplifier with a cutoff frequency of 400 hertz and a stage gain which is equal to the impedance of the parallel combination of the resistor 140 and the capacitor 142 divided by the impedance of the resistor 136 plus the impedance of the parallel combination of the capacitor 134 and the resistor 132. The voltage signal appearing between the voltage sensing plate 62 and ground is amplified and inverted by the operational amplifier 116. The output signal of the amplifier 116 is coupled by the resistor 144 and the capacitor 146 to the inverting input of the operational amplifier 118, which is a voltage amplifier with a stage gain determined by the impedance of the feedback resistor 150.

When the output signal of the operational amplifier 118 is positive with respect to ground, it is coupled by the diode 152 to the non-inverting input of the operational amplifier 120 to produce a positive signal at the output of operational amplifier 120. When the output signal of the operational amplifier 118 is negative with respect to ground, it is coupled by the resistor 154 and the diode 156 to the inverting input of the operational amplifier 120, to again produce a positive signal at the output of the operational amplifier 120. When the output signal of the operational amplifier 118 is positive, the operational amplifier 120 acts as a unity gain amplifier, to produce a positive output signal which is in phase with, and has the same amplitude as, the positive signal supplied to the non-inverting input of the operational amplifier 120. When the output signal of the operational amplifier 118 is negative, the operational amplifier 120 acts as an inverting amplifier having a stage gain equal to the impedance of the resistor 160 divided by the impedance of the resistor 154. Since the impedance of the resistor 154 is equal to the impedance of the resistor 160, the inverting gain is one, or unity. Thus, the operational amplifier 120 acts as an "absolute value circuit", or a full wave rectifier.

The positive polarity output signal of the operational amplifier 120 is supplied to a rectifier and filter circuit consisting of the diode 162, the resistors 164 and 170, and the capacitor 168 to produce a smooth, positive polarity, direct voltage signal across the capacitor 168 which is proportional to the alternating voltage signal supplied to the input terminals 112 and 114 of the voltage level detection circuit 106. The operational amplifier 122 is connected as a signal comparator with hysteresis. A constant level, positive polarity, direct voltage signal is supplied to the inverting input of the operational amplifier 122 from a voltage divider circuit consisting of the series-connected resistors 172 and 174 which are connected across the positive polarity 15 volt DC output P of the DC power supply 124. When the voltage at the non-inverting input of the operational amplifier 122 is less than the constant level, positive polarity voltage at the inverting input of the operational amplifier 122, the output of the operational amplifier 122 will be at a negative polarity voltage of approximately 15 volts, since the inverting input is positive with respect to the non-inverting input of the operational amplifier 122. The voltage at the non-inverting input of the operational amplifier 122 will be somewhat less than the voltage across the capacitor 168 to which it is connected by the resistor 166, since the non-inverting input of the operational amplifier 122 is also connected by the resistor 176 to the output of the operational amplifier 122 which is maintained at a negative polarity voltage of approximately 15 volts.

When the voltage at the non-inverting input of the operational amplifier 122 becomes greater than the constant level, direct voltage at the inverting input of the operational amplifier 122, the output of the operational amplifier 122 is switched to a positive polarity, direct voltage level of approximately 15 volts because the inverting input is now negative with respect to the non-inverting input of the operational amplifier 122. At the same time, the voltage at the non-inverting input of the operational amplifier 122 is increased somewhat above the voltage of the capacitor 168, since an additional positive potential voltage input is provided by the resistor 176 from the output of the operational amplifier 122, which is now maintained at a positive polarity direct voltage level of approximately 15 volts.

When the alternating voltage at the connector stud 18 starts to decrease, the positive polarity direct voltage signal at the non-inverting input of the operational amplifier 122 will also decrease. When the direct voltage at the non-inverting input of the operational amplifier 122 becomes less than the constant level direct voltage at the inverting input of the operational amplifier 122, the direct voltage signal appearing at the output of the operational amplifier 122 will be switched back to a negative polarity direct voltage level of approximately 15 volts. At the same time, because of the resistor 176 connected between the output and non-inverting input of the operational amplifier 122, the positive polarity direct voltage appearing at the non-inverting input of the operational amplifier 122 will be switched from a value higher than the voltage appearing across the capacitor 168 to a value lower than the voltage appearing across the capacitor 168.

Thus, the resistor 176 provides hysteresis for the output signal switching operations of the operational amplifier 122. As the alternating voltage at the connector stud 18 increases from a low value, the direct voltage output signal of the operational amplifier 122 will be switched from the negative polarity, direct voltage level of approximately 15 volts to the positive polarity, direct voltage level of approximately 15 volts when the alternating voltage at the connector stud 18 rises to a first predetermined value. The direct voltage output signal of the operational amplifier 122 will remain at the positive polarity, direct voltage level of 15 volts until the alternating voltage at the connector stud 18 has decreased to a second predetermined value lower than the first predetermined value, at which time the direct voltage output signal of the operational amplifier 122 will be switched back to the negative polarity, direct voltage level of approximately 15 volts. The voltage difference between the first and second predetermined voltage levels of the alternating voltage at the connector stud 18 will be inversely proportional to the resistance of the resistor 176. If the resistance of the resistor 176 is increased, the voltage difference, or hysteresis, between the first and second alternating voltage levels of the connector stud 18 at which the output signal of the operational amplifier 122 will be switched from its negative polarity level to its positive polarity level and from its positive polarity level to its negative polarity level respectively, will be decreased. Thus, if the resistor 176 is removed, the first voltage level at which the output signal of the operational amplifier 122 is switched from its negative polarity level to its positive polarity level would be the same as the second alternating voltage level of the connector stud 18 at which the output signal of the operational amplifier 122 is switched from its positive polarity level to its negative polarity level.

Figure 7:
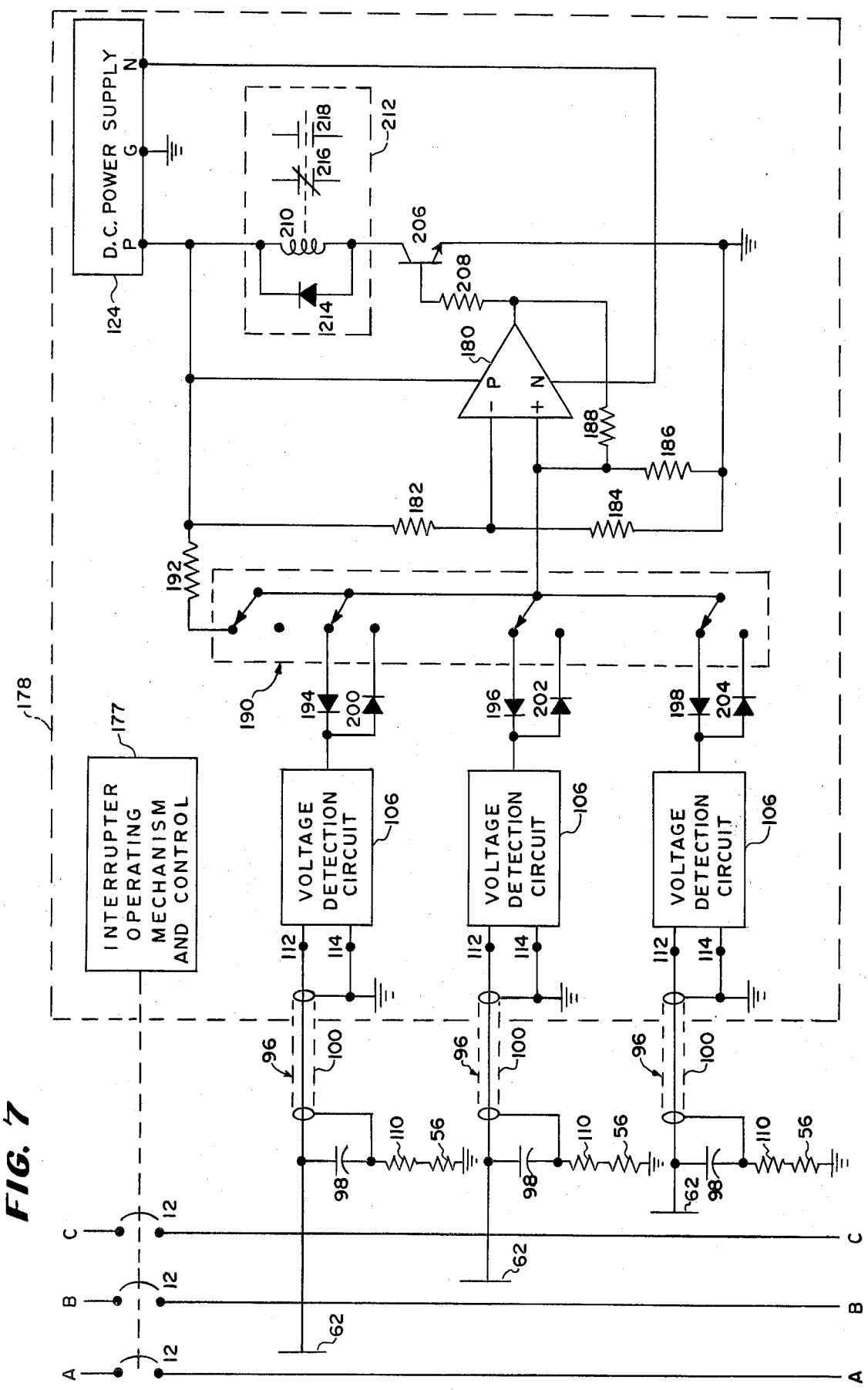
FIG. 7 is an electrical schematic diagram of another embodiment of the invention, in which three encapsulated vacuum interrupters are connected as a three phase circuit interrupter.

Referring now to FIG. 7, the vacuum interrupters 12 of three encapsulated vacuum interrupter assemblies 10 are disposed in the three phase lines A, B and C respectively, of a three phase, electric power system. The three vacuum interrupters 12 are connected to a common interrupter operating mechanism and control 177, similar to that disclosed in the above-referenced U.S. Patent application Ser. No. 836,711. Each of the encapsulated vacuum interrupter assemblies 10 include a voltage sensing plate 62 which is connected in series with the capacitor 98 and the conductive coatings 56 and 110 to ground, as discussed above. The voltage signals appearing across the capacitors 98 of the encapsulated vacuum breaker assemblies 10 are supplied to the inputs of three voltage level detection circuits 106 in a low voltage switchgear control compartment 178 through three coaxial leads 96. Each other conductive shield 100 of the three coaxial leads 96 is solidly grounded at one end in the low voltage switchgear control compartment 178, and is also connected to ground at its opposite end, through the relatively high resistance conductive coatings 56 and 110 of one of the encapsulated vacuum breaker assemblies 10 to the grounded support structure for the encapsulated vacuum interrupter assemblies 10.

The operating power terminals P and N of a switching amplifier 180 are connected to the positive and negative polarity output terminals P and N of the dual voltage, DC power supply 124. The inverting input of the switching amplifier 180 is connected to the positive polarity output terminal P of the DC power supply 124 through a resistor 182, and to ground through a resistor 184. The non-inverting input of the switching amplifier 180 is connected to ground through a resistor 186, and to the output of the switching amplifier 180 through a resistor 188. The non-inverting input of the switching amplifier 180 is also connected to the four common terminals of a four pole, double throw, toggle switch 190. When the toggle switch 190 is disposed in the position shown in FIG. 8, the common terminals of the toggle switch 190 are connected to the positive polarity output terminal P of the DC power supply 124 through a resistor 192, and to the outputs of the three voltage level detection circuits 106 through diodes 194, 196, and 198 respectively. The diodes 194, 196 and 198 are connected to allow current flow from the toggle switch 190 to the voltage level detection circuits 106, and to block current flow from the voltage level detection circuits 106 to the toggle switch 190.

When the toggle switch 190 is in its alternate position, the common terminals of the toggle switch 190 are disconnected from the resistor 192, and are connected to the outputs of the three voltage level detection circuits 106 by diodes 200, 202 and 204 respectively, which are connected to allow current flow from the voltage level detection circuits 106 to the toggle switch 190, and to block current flow from the toggle switch 190 to the voltage level detection circuits 106.

The base of a PNP transistor 206 is connected to the output of the switching amplifier 180 through a resistor 208. The emitter of the transistor 206 is connected to ground. An operating coil 210 of a relay 212 has a first end connected to the positive polarity output terminal P of the DC power supply 124, and the second end connected to the collector of the transistor 206. A diode 214 is connected across the operating coil 210 to allow current flow from the second end of the operating coil 210 to the first end of the operating coil 210. The relay 212 includes a normally closed contact 216 and a normally open contact 218.

The resistors 182 and 184 connected in series between the positive polarity output terminal P of the DC power supply 124 and ground form a voltage divider circuit to supply to the inverting input of the switching amplifier 180 a constant level positive polarity voltage which is less than the positive polarity, direct voltage output of the DC power supply 124. When the voltage supplied to the non-inverting input of the switching amplifier 180 is less than the constant level, position polarity voltage supplied to the inverting input of the switching amplifier 180, the voltage at the output of the switching amplifier 180 will be at a negative polarity voltage level of approximately 15 volts to maintain the transistor 206 in its non-conducting state, and the relay 212 will be de-energized. When the voltage supplied to the non-inverting input of the switching amplifier 180 increases above the constant level, positive polarity voltage supplied to the inverting input of the switching amplifier 180, the voltage at the output of the switching amplifier 180 becomes a positive polarity direct voltage of approximately 15 volts, and the transistor 206 is switched to its conducting state to energize the relay 212.

When the toggle switch 190 is in the position shown in FIG. 8, hereinafter called its AND position, the non-inverting input of the switching amplifier 180 is connected to the 15 volt positive polarity output terminal of the DC power supply 124 through the resistor 192, and to the outputs of the three voltage level detection circuits 106 by the diodes 194, 196 and 198. When the voltage of each phase line A, B, and C of the electric power distribution system is above a first predetermined value, the output voltage of each of the voltage level detection circuits 106 will be a positive polarity voltage and approximately 15 volts, and the diodes 194, 196 and 198 will be a reverse biased. When all three diodes 194, 196 and 198 are reverse biased, the resistors 192 and 186, which are connected in series between the positive polarity 15 volt output terminal of the DC power supply 124 and ground through the toggle switch 190, will form a voltage divider circuit for supplying a constant level positive polarity voltage to the non-inverting input of the switching amplifier 180. The relative values of the resistors 192 and 186 are selected to supply a constant level, positive polarity voltage to the non-inverting input of the switching amplifier 180 which is higher than the constant level, positive polarity voltage supplied to the inverting input of the switching amplifier 180.

Thus, when all three phase voltages of the electric power system are above the first predetermined value, the three diodes 194, 196 and 198 will be reverse biased, the voltage at the non-inverting input of the switching amplifier 180 will be higher than the voltage at the inverting input of the switching amplifier 180, the voltage at the output of the switching amplifier 180 will be a positive polarity voltage of approximately 15 volts, the transistor 206 will be turned on, and the relay 212 will be energized.

If any one of the three phase voltages of the electric power system falls below a second predetermined value, the output of the voltage level detection circuit 106 associated with that phase will be switched to a negative polarity voltage of approximately 15 volts, one of the three diodes 194, 196 and 198 which is connected to the voltage level detection circuit 106 will conduct, and the voltage at the non-inverting input of the switching amplifier 180 will be switched to a negative polarity voltage. When this occurs, the voltage at the output of the switching amplifier 180 will be switched to a negative polarity voltage of approximately 15 volts, the transistor 206 will be rendered nonconductive, the relay 212 will be de-energized and the current flowing through the operating coil 210 will be switched to flow through the diode 214 for a brief period of time until the magnetic energy stored in the operating coil has been dissipated.

Thus, when the phase-to-ground voltages of all three phase conductors A, B, and C of the electric power system are above the first predetermined value, the relay 212 will be energized. Then, if any one of the phase-to-ground voltages falls below the second predetermined value, the relay 212 will be de-energized.

When the toggle switch 190 is disposed in its second position, hereinafter called its OR position, the non-inverting input of the switching amplifier 180 is disconnected from the resistor 192, and is connected to the outputs of the voltage level detection circuits 106 through the diodes 200, 202 and 204 respectively. When all three of the phase-to-ground voltages of the phase conductors A, B, and C are below the second predetermined value, the voltage at the outputs of the three voltage level detection circuits 106 will be a negative polarity voltage of approximately 15 volts. Since the non-inverting input of the switching amplifier 180 is no longer connected to a source of positive polarity voltage, the constant level, positive polarity voltage supplied to the inverting input of the switching amplifier 180 will produce a negative polarity voltage at the output of the switching amplifier 180 of approximately 15 volts, which is applied to the base of the transistor 206 through the resistor 208 to maintain the transistor 206 in its non-conducting state and the relay 212 de-energized.

When the phase-to-ground voltage of any one of the three phase conductors A, B, or C of the electric power system rises above the first predetermined value, the output of the voltage level detection circuit 106 associated with that phase conductor is switched to a positive polarity voltage of approximately 15 volts, the diode 200, 202, or 204 connected between the output and the non-inverting input of the switching amplifier 180 through the toggle swich 190 will be forward biased, and the voltage appearing at the non-inverting input of the switching amplifier 180 will be the positive polarity output signal of approximately 15 volts at the voltage level detection circuit 106 less the forward voltage drop through one of the diodes 200, 202, or 204. Since the positive polarity voltage signal now applied to the non-inverting input of the switching amplifier 180 is higher than the constant level positive polarity voltage applied to the inverting input of the switching amplifier 180, the voltage at the output of the switching amplifier 180 will be a positive polarity voltage of approximately 15 volts. When the output signal of the switching amplifier 180 is switched to a positive polarity voltage of approximately 15 volts, the transistor 206 will be turned on to energize the relay 212. Thus, whenever the phase-to-ground voltge of any one of the three phase conductors A, B and C exceeds the first predetermined value, the relay 212 is energized, and remains energized until the phase-to-ground voltage of that phase conductor A, B, or C falls below the second predetermined value.

Various modifications and adaptations of the foregoing specific disclosure can be made without departing from the teachings of the present invention. For example, when no current transformer is encapsulated in the epoxy housing 70, the switchgear end of the outer shield 100 of the coaxial lead 96 can be used in place of the metal tube 86 by connecting the outer shield 100 directly to the grounded side of the capacitor 98 and applying the conductive coating 110 to the external surface of the epoxy housing 70, and to the adjacent portions of the outer shield 100 extending through the external surface of the epoxy housing 70. Hence it is intended that the spirit and scope of this invention be limited only by the appended claims.

What is claimed is:

1. A voltage level sensing apparatus for sensing at least one phase-to-ground voltage of a high-voltage alternating electric system, including at least one single phase voltage sensing circuit which comprises:

a body of cast, electrically insulating material;

a conductive rod, partially embedded within the cast body, having one end connected to one phase of the alternating power system;

a voltage sensing plate which is embedded in the cast body and spaced from the rod to define, with the rod, a first capacitor wherein the portion of the cast body between the rod and the voltage sensing plate is the dielectric of the first capacitor;

a second capacitor, also embedded within the cast body, having a first side connected to the voltage sensing plate and an opposite second side, the second capacitor having a low impedance relative to the impedance of the first capacitor;

first conductive means for defining a current path between the second side of the second capacitor and ground, which has a low impedance relative to the impedance of the first capacitor;

a coaxial lead, which includes a center conductor and an outer conductive shield, each having corresponding first ends and opposite second ends, the first end of the center conductor being connected to the first side of the second capacitor, and the first end of the outer shield being connected to the second side of the second capacitor;

second conductive means for defining a current path between the second end of the outer shield of the coaxial lead and ground, which has a low impedance relative to the impedance of the first conductive means; and amplifier means having an output, a first input connected to the second end of the center conductor of the coaxial lead, and a second input connected to the second end of the outer shield of the coaxial lead, for producing at the amplifier output an alternating signal proportional to one phase-to-ground voltage of the alternating electric system.

2. A voltage level sensing apparatus, as described in claim 1, which further comprises a DC power supply means for supplying at least one constant level, direct voltage reference signal, and wherein said at least one single phase voltage sensing circuit further comprises:

full wave rectifier means, having an output and an input connected to receive the alternating output signal produced by the amplifier means, for producing at its output a direct voltage signal proportional to an absolute value of one phase-to-ground voltage of the alternating electric system; and signal comparator means with hysteresis, having an output, a non-inverting input, an input resistor connected between the signal comparator non-inverting input and the output of the full wave rectifier means, a feedback resistor connected between the signal comparator non-inverting input and the signal comparator output, and an inverting input connected to receive a first, constant level, direct voltage reference signal from the DC power supply means, for producing and switching an output signal between a first direct voltage level and a second direct voltage level which is positive relative to the first direct voltage level, wherein the signal comparator output signal is switched from the first direct voltage level to the second direct voltage level whenever the phase-to-ground voltage of the alternating power system exceeds a first predetermined value, and thereafter the signal comparator output signal is switched from the second voltage level to the first voltage level whenever the phase-to-ground voltage of the alternating power system decreases to less than a second predetermined value which is less than the first predetermined value of the phase-to-ground voltage, the difference between the first and second predetermined values of the phase-to-ground voltage being inversely proportional to the feedback resistor.

3. A voltage level sensing apparatus, as described in claim 2, wherein the alternating electric system is a three phase system, said at least one single phase voltage sensing circuit includes first, second, and third single phase voltage sensing circuits coupled respectively to the three phases of the alternating electric system, and the voltage level sensing apparatus further comprises:

a switching amplifier means, having an output, a non-inverting input, and an inverting input connected to receive from the DC power supply means a second, constant level, direct voltage reference signal which is intermediate the first and second direct voltage levels of the signal comparator output signals of the single phase voltage sensing circuits, for producing and switching an output signal between a third direct voltage level and a fourth direct voltage level, wherein the switching amplifier output signal is switched from the third direct voltage level to the fourth direct voltage level whenever the voltage at the switching amplifier non-inverting input rises above the second, constant level, direct voltage reference signal supplied to the switching amplifier inverting input, and the switching amplifier output signal is switched from the fourth direct voltage level to the third direct voltage level whenever the voltage at the switching amplifier non-inverting input falls below the second, constant level, direct voltage reference signal supplied to the switching amplifier inverting input;

first, second, and third diodes connected between the switching amplifier non-inverting input and the signal comparator outputs of the first, second, and third single phase voltage sensing circuits, respectively, to allow current flow from any signal comparator output of the single phase voltage sensing circuits to the switching amplifier non-inverting input, and to block current flow from the switching amplifier non-inverting input to any signal comparator output of the single phase voltage sensing circuits;

whereby the switching amplifier output signal is switched from the third direct voltage level to the fourth direct voltage level whenever at least one phase-to-ground voltage of the alternating power system exceeds the first predetermined value, and the switching amplifier output signal is thereafter switched from the fourth direct voltage level to the third direct voltage level when said at least one phase-to-ground voltage decreases to a value less than the second predetermined value of the phase-to-ground voltage.

4. A voltage level sensing apparatus, as described in claim 1, which further comprises a DC power supply means for supplying at least one constant level, direct voltage reference signal, and wherein said at least one single phase voltage sensing circuit further comprises:
full wave rectifier means, having an output and an input which is connected to receive the alternating output signal produced by the amplifier means, for producing at its output a positive polarity direct voltage signal proportional to an absolute value of one phase-to-ground voltage of the alternating power system; and
signal comparator means with hysteresis, having an output, a non-inverting input, an input resistor connected between the signal comparator non-inverting input and the output of the fullwave rectifier means, a feedback resistor connected between the signal comparator non-inverting input and the signal comparator output, and an inverting input connected to receive a first, positive polarity, constant level, direct voltage reference signal from the DC power supply means, for producing and switching an output signal between a first negative polarity direct voltage level and a first positive polarity direct voltage level, wherein the signal comparator output signal is switched from the first negative polarity direct voltage level to the first positive polarity direct voltage level whenever the phase-to-ground voltage of the alternating electric system exceeds a first predetermined value, and thereafter the signal comparator output signal is switched from the first positive polarity voltage level to the first negative polarity voltage level whenever the phase-to-ground voltage of the alternating electric system decreases to less than a second predetermined value which is less than the first predetermined value of the phase-to-ground voltage, wherein the difference between the first and second predetermined values is inversely proportional to the feedback resistor.

5. A voltage level sensing apparatus, as described in claim 4, wherein the alternating electric system is a three phase system, said at least one single phase voltage sensing circuit includes first, second and third single phase voltage sensing circuits, coupled respectively to the three phases of the alternating electric system, and the voltage level sensing apparatus further comprises:
a switching amplifier means, having an output, a non-inverting input, and an inverting input connected to receive from the DC power supply means a second, positive polarity, direct voltage reference signal which is less than the first positive polarity, direct voltage level of the signal comparator output signals of the single phase voltage sensing circuits, for producing and switching an output signal between a second negative polarity direct voltage level and a second positive polarity direct voltage level, wherein the switching amplifier output signal is switched from the second negative polarity direct voltage level to the second positive polarity direct voltage level whenever the voltage at the switching amplifier non-inverting input rises above the second, positive polarity, constant level, direct voltage reference signal supplied to the switching amplifier inverting input, and the switching amplifier output signal is switched from the second, positive polarity, direct voltage level to the second, negative polarity, direct voltage level whenever the voltage at the switching amplifier non-inverting input falls below the second, positive polarity, constant level, direct voltage reference signal supplied to the switching amplifier inverting input;
first, second, and third diodes connected between the switching amplifier non-inverting input and the signal comparator outputs of the first, second and third single phase voltage sensing circuits, respectively, to block current flow from any signal comparator output of the single phase voltage sensing circuits to the switching amplifier non-inverting input, and to allow current flow from the switching amplifier non-inverting input to any signal comparator output of the single phase voltage sensing circuits; and
a voltage divider circuit which includes a first resistor connected between the switching amplifier non-inverting input and the DC power supply means to receive a third positive polarity, constant level, direct voltage reference signal and second resistor connected between the switching amplifier non-inverting input and ground, the third, positive polarity, constant level, direct voltage reference signal and the first and second resistors being selected so that when the three signal comparator output signals of the single phase voltage sensing circuits have been switched to the first positive polarity direct voltage level, a positive polarity direct voltage signal, which is intermediate the first, positive polarity voltage level of the signal comparator output signals and the second positive polarity direct voltage reference signal supplied to the switching amplifier inverting input, is supplied to the switching amplifier non-inverting input, and when at least one signal comparator output signal has been switched to its first negative polarity voltage level, the positive polarity direct voltage signal supplied to the switching amplifier non-inverting input decreases to a voltage level which is less than the second positive polarity, constant level, direct voltage reference signal supplied to the switching amplifier inverting input;
whereby, the switching amplifier output signal is switched from the second, negative polarity, direct voltage level to the second, positive polarity, direct voltage level only when all three of the phase-to-ground voltages of the alternating power system exceeds the first predetermined value, and the switching amplifier output signal is thereafter switched back to the second, negative polarity, direct voltage level when any of the three phase-to-ground voltages of the alternating electric system falls below the second predetermined value.

6. A voltage level sensing apparatus, as described in claim 5, which further comprises:
switching means, disposed between the switching amplifier non-inverting input, the voltage divider first resistor, and the first, second and third diodes, which is movable between a first position and a second position, wherein the voltage divider first resistor is connected between the DC power supply means and the switching amplifier non-inverting input, and the first, second and third diodes are connected between the switching amplifier non-inverting input and the signal comparator outputs of the first, second and third single phase voltage sensing circuits, respectively, when the switching means is disposed in the first position, and the switching amplifier non-inverting input is disconnected from the voltage divider first resistor and the first, second and third diodes when the switching means is disposed in its second position; and fourth, fifth, and sixth diodes connected between the switching means and the signal comparator outputs of the first, second and third single phase voltage sensing circuits respectively, in opposite manner to the first, second and third diodes, wherein the fourth, fifth, and sixth diodes are connected to the switching amplifier non-inverting input to allow current flow from any signal comparator output to the switching amplifier non-inverting input and to block current flow from the switching amplifier non-inverting input to any signal comparator output when the switching means is disposed in its second position, and the fourth, fifth, and sixth diodes are disconnected from the switching amplifier non-inverting input when the switching means is disposed in its first position;

whereby, when the switching means is disposed in its first position, the switching amplifier output signal is switched from the second, negative polarity, direct voltage level to the second, positive, direct voltage level only when all three phase-to-ground voltages of the alternating electric system exceeds the first predetermined value, and thereafter is switched back to the second, negative polarity, direct voltage level when any of the three phase-to-ground voltages of the alternating electric system falls below the second predetermined level, and, when the switching means is disposed in its second position, the switching amplifier output signal is switched from the second, negative polarity, direct voltage level to the second, positive polarity, direct voltage level whenever at least one phase-to-ground voltage of the alternating electric system exceeds the first predetermined value, and thereafter is switched back to the second, negative polarity, direct voltage level when said at least one phase-to-ground voltage falls below the second predetermined value.

7. A voltage level sensing apparatus, as described in claim 6, which further comprises:
a PNP transistor, having a collector, an emitter connected to ground, and a base connected to receive the switching amplifier output signal; and
a relay, having an operating coil which is connected at one end to the collector of the PNP transistor and at opposite end to the DC power supply means to receive a positive potential direct voltage signal;
whereby the transistor is rendered conductive and the relay is energized whenever the switching amplifier output signal is switched to the second, positive polarity, direct voltage level, and the transistor is rendered non-conductive and the relay is de-energized whenever the switching amplifier output signal is switched to its second, negative polarity, direct voltage level.

8. A voltage level sensing apparatus, as described in claim 1, wherein said at least one single phase voltage sensing circuit further comprises:
a thermistor which is embedded in the cast body of electrical insulating material in close proximity to a central portion of the voltage sensing plate, and which is connected across the second capacitor; and a resistor, which is embedded in the cast body and connected across the second capacitor;
whereby the thermistor and resistor serve as a temperature compensating network to compensate for temperature-induced changes in the dielectric properties of the portion of the cast body disposed between the voltage sensing plate and conductive rod.

9. A voltage level sensing apparatus, as described in claim 1, wherein the first conductive means comprises:
a solidly grounded metal support structure;
conductive mounting means for affixing the cast body to the grouned support structure;
a conductive member, having a first end embedded in the cast body and a second end extending through an exterior surface of the cast body, wherein the second side of the second capacitor is connected to the second end of the conductive member; and
at least one conductive coating, applied to the exterior surface of the cast body between the mounting means and the conductive member;
whereby the second side of the second capacitor is connected in series with the conductive member, said at least one conductive coating, and the conductive mounting means to the solidly grounded support structure.

10. A voltage level sensing apparatus, as described in claim 1, which further comprises:
a vacuum interrupter assembly which includes:
a vacuum interrupter having a stationary contact rod extending through one end of the vacuum interrupter and a movable contact rod extending through an opposite end of the vacuum interrupter, the movable contact rod being movable along its axis between an open position and a closed position, the stationary contact rod and the movable contact rod having adjacent ends carrying respective contacts which abut against each other when the movable contact rod is in its closed position, and which are separated by suitable distance when the movable contact rod is in its open position,
a first connector stud having one end affixed to the stationary contact rod and at opposite end extending out of the cast body of electrically insulating material,
a second connector stud having one end which is held in sliding contact with the movable contact rod and an opposite end which extends out of the cast body of electrically insulating material; and
the cast body of electrically insulating material including a first end portion cast about the first connector stud, and a second end portion cast about the second connector stud;
wherein the conductive rod of the first capacitor is one of the two connector studs of the vacuum interrupter assembly.

11. A voltage level sensing apparatus, as described in claim 1, which further comprises;
a current transformer, embedded in the cast body, having a core of magnetic material which encircles the conductive rod, a secondary winding which is wound about the core, and two insulated conductive leads which have first ends connected to respective ends of the secondary winding and second ends extending outside the cast body.

12. Switchgear apparatus for a high voltage alternating electric system which includes a grounded support structure and at least one encapsulated, single phase, circuit interrupter assembly which is affixed to the grounded support structure, and which comprises:

a vacuum interrupter having a fixed contact rod extending through one end of a vacuum enclosure and a movable contact rod extending through an opposite end of the vacuum enclosure, the movable contact rod being movable along its axis between an open position and a closed position, adjacent ends of the fixed contact rod and the movable contact rod carrying respective contacts which abut against each other when the movable contact rod is disposed in its closed position, and which are separated by a suitable distance when the movable contact rod is disposed in its open position;

a first connector stud, having one end attached to the fixed contact rod and an opposite end;

a second connector stud, having one end which carries a current exchange assembly in sliding contact with the movable contact rod, and an opposite end;

an interrupter housing of cast, electrically insulating material which includes
- a central portion cast about the vacuum interrupter and defining an opening through which the movable contact rod extends,
- a first end portion extending from the central portion and cast about the first connector stud, having a free end through which the opposite end of the first connector stud extends, the free end of the first end portion defining a first receiving bushing member, and
- a second end portion extending from the central portion and cast about the second connector stud, having a free end through which the opposite end of the second connector stud extends, the free end of the second end portion defining a second receiving bushing member;

a first conductive coating, which is applied to the outer surface of the interrupter housing intermediate the first and second receiving bushing members, and which defines an uncoated window area, or opening in the first conductive coating, on the outer surface of one of the two end portions of the interrupter housing;

a mounting means for affixing the interrupter housing to the grounded support structure and electrically connecting the first conductive coating to the grounded support structure;

a second housing of cast electrically insulating material, having an inner surface spaced from the one end portion of the interrupter housing over the uncoated window area thereof, and external side and outer surfaces, the second housing being affixed to the interrupter housing by electrically insulating material which is cast between the inner surface of the second housing and the outer surface of the interrupter housing to completely fill the space therebetween and form a single switchgear housing;

a voltage sensing plate, positioned adjacent the uncoated window area of the one end portion of interrupter housing, which defines, with the connector stud embedded within the one end portion of the interrupter housing, a first capacitor wherein the cast electrically insulating material between the voltage sensing plate and the connector stud embedded in the one end porton of the interrupter housing is a dielectric of the first capacitor;

a conductive member, having a first end which is embedded in the second housing and a second end which extends through an external surface of the second housing;

a second capacitor, embedded within the second housing, having a first side connected to the voltage sensing plate and an opposite second side connected to the conductive member, the second capacitor having a low impedance relative to the impedance of the first capacitor;

a coaxial lead, which includes a center conductor and an outer conductive shield, each having corresponding first ends and opposite second ends, the first end of the center conductor being connected to the first side of the second capacitor, and the first end of the outer shield being connected to second side of the second capacitor, the coaxial lead extending outside of the second housing through an external surface of the second housing;

a second conductive coating, applied to the external surfaces of the second housing and to the adjacent coated surfaces of the one end portion of the interrupter housing, and to the externally extending second end of the conductive member, wherein the first and second conductive coating define a resistive current path between the conductive member and ground which has a low impedance relative to the impedance of the first capacitor, and the first capacitor, the second capacitor, and the resistive current path are connected in series between one phase of the alternating electric system and ground;

whereby, because of the low impedance of the second capacitor and the resistive current path, both sides of the second capacitor are maintained at a low voltage, and the voltage across the second capacitor is proportional to one phase-to-ground voltage of the alternating electric system.

13. Switchgear apparatus, as described in claim 12 wherein said at least one encapsulated single phase circuit interrupter assembly further comprises:

a thermistor which is embedded in the cast electrically insulating material in close proximity to a central portion of the voltage sensing plate and which is connected across the second capacitor; and a resistor, which is embedded in the cast electrical insulating material and connected across the second capacitor;

whereby the thermistor and resistor serve as a temperature compensating network to compensate for temperature-induced changes in the dielectric properties of the cast electrical insulating material disposed between the voltage sensing plate and the connector stud embedded in the one end portion of the interrupter housing.

14. Switchgear apparatus, as described in claim 12, wherein said at least one encapsulated single phase circuit ininterrupter assembly further comprises:

amplifier means having an output, a first input connected to the second end of the center conductor of the coaxial lead, and a second input connected to the second end of the outer shield of the coaxial lead and to ground, for producing at the amplifier output an alternating signal proportional to one phase-to-ground voltage of the alternating electric system, wherein the connection between the second end of the outer shield of the coaxial lead and ground has a low impedance relative to the impedance of the resistive current path defined by the first and second conductive coatings between the first end of the outer shield of the coaxial lead and ground.

15. Switchgear apparatus, as described in claim 14, which further comprises a DC power supply means for supplying at least one constant level, direct voltage reference signal, and wherein said at least one encapsulated single phase circuit interrupter assembly further comprises:

full wave rectifier means, having an output and an input which is connected to receive the alternating output signal produced by the amplifier means, for producing at its output a positive polarity direct voltage signal proportional to an absolute value of one phase-to-ground voltage of the alternating power system; and signal comparator means with hysteresis, having an output, a non-inverting input, an input resistor connected between the signal comparator non-inverting input and the output of the full wave rectifier means, a feedback resistor connected between the signal comparator non-inverting input and the signal comparator output, and an inverting input connected to receive a first, positive polarity, constant level, direct voltage reference signal from the DC power supply means, for producing and switching an output signal between a first negative polarity direct voltage level and a first positive polarity direct voltage level, wherein the signal comparator output signal is switched from the first negative polarity direct voltage level to the first positive polarity direct voltage level whenever the phase-to-ground voltage of the alternating electric system exceeds a first predetermined value, and thereafter the signal comparator output signal is switched from the first positive polarity voltage level to the first negative polarity voltage level whenever the phase-to-ground voltage of the alternating electric system decreases to less than a second predetermined value which is less than the first predetermined value of the phase-to-ground voltage, wherein the difference between the first and second predetermined values is inversely proportional to the feedback resistor.

16. Switchgear apparatus, as described in claim 15, wherein the alternating electric system is a three phase system, said at least one encapsulated single phase circuit interrupter assembly includes first, second, and third encapsulated single phase circuit interrupter assemblies, coupled respectively to the three phases of the alternating power system and the switchgear apparatus further comprises:

a switching amplifier means, having an output, a non-inverting input, and an inverting input connected to receive from the DC power supply means a second, positive polarity, direct voltage reference signal which is less than the first positive polarity, direct voltage level of the signal comparator output signals of the single phase voltage sensing circuits, for producing and switching an output signal between a second negative polarity direct voltage level and a second positive polarity direct voltage level, wherein the switching amplifier output signal is switched from the second negative polarity direct voltage level to the second positive polarity direct voltage level whenever the voltage at the switching amplifier non-inverting input rises above the second, positive polarity, constant level, direct voltage reference signal supplied to the switching amplifier inverting input, and the switching amplifier output signal is switched from the second, positive polarity, direct voltage level to the second, negative polarity direct voltage level whenever the voltage at the switching amplifier non-inverting input falls below the second, positive polarity, constant level, direct voltage reference signal supplied to the switching amplifier inverting input;

first, second, and third diodes connected between the switching amplifier non-inverting input and the signal comparator outputs of the first, second and third single phase voltage sensing circuits, respectively, to block current flow from any signal comparator output of the single phase voltage sensing circuits to the switching amplifier non-inverting input, and to allow current flow from the switching amplifier non-inverting input to any signal comparator output of the single phase voltage sensing circuits; and a voltage divider circuit which includes a first resistor connected between the switching amplifier non-inverting input and the DC power supply means to receive a third positive polarity, constant level, direct voltage reference signal and a second resistor connected between the switching amplifier non-inverting input and ground, the third, positive polarity, constant level, direct voltage reference signal and the first and second resistors being selected so that when the three signal comparator output signals of the single phase voltage sensing circuits have been switched to the first positive polarity direct voltage level, a positive polarity direct voltage signal, which is intermediate the first, positive polarity voltage level of the signal comparator output signals and the second positive polarity direct voltage reference signal supplied to the switching amplifier inverting input, is supplied to the switching amplifier non-inverting input, and when at least one signal comparator output signal has been switched to its first negative polarity voltage level, the positive polarity direct voltage signal supplied to the switching amplifier non-inverting input decreases to a voltage level which is less than the second positive polarity, constant level, direct voltage reference signal supplied to the switching amplifier inverting input;

whereby, the switching amplifier output signal is switched from the second, negative polarity, direct voltage level to the second, positive polarity, direct voltage level only when all three of the phase-to-ground voltages of the alternating power system exceeds the first predetermined value, and the switching amplifier output signal is thereafter switched back to the second, negative polarity, direct voltage level when any of the three phase-to-ground voltages of the alternating electric system falls below the second predetermined value.

17. Switchgear apparatus, as described in claim 16, which further comprises:

switching means, disposed between the switching amplifier non-inverting input, the voltage divider first resistor, and the first, second and third diodes, which is movable between a first position and a second position, wherein the voltage divider first resistor is connected between the DC power supply means and the switching amplifier non-inverting input, and the first, second and third diodes are connected between the switching amplifier non-inverting input and the signal comparator outputs of the first, second and third single phase voltage sensing circuits, respectively, when the switching means is disposed in the first position, and the switching amplifier non-inverting input is disconnected from the voltage divider first resistor and the first, second and third diodes when the switching means is disposed in its second position; and forth, fifth, and sixth diodes connected between the switching means and the signal comparator outputs of the first, second and third single phase voltage sensing circuits respectively, in opposite manner to the first, second and third diodes, wherein the fourth, fifth, and sixth diodes are connected to the switching amplifier non-inverting input to allow current flow from any signal comparator output to the switching amplifier non-inverting input and to block current flow from the switching amplifier non-inverting input to any signal comparator output when the switching means is disposed in its second position, and the fourth, fifth, and sixth diodes are disconnected from the switching amplifier non-inverting input when the switching means is disposed in its first position;

whereby, when the switching means is disposed in its first position, the switching amplifier output signal is switched from the second, negative polarity, direct voltage level to the second, positive, direct voltage level only when all three phase-to-ground voltages of the alternating electric system exceeds the first predetermined value, and thereafter is switched back to the second, negative polarity, direct voltage level when any of the three phase-to-ground voltages of the alternating electric system falls below the second predetermined level, and, when the switching means is disposed in its second position, the switching amplifier output signal is switched from the second, negative polarity, direct voltage level to the second, positive polarity, direct voltage level whenever at least one phase-to-ground voltage of the alternating electric system exceeds the first predetermined value, and thereafter is switched back to the second, negative polarity, direct voltage level when said at least one phase-to-ground voltage falls below the second predetermined value.

18. Switchgear apparatus, as described in claim 17, which further comprises:
a PNP transistor, having a collector, an emitter connected to ground, and a base connected to receive the switching amplifier output signal; and
a relay, having an operator coil which is connected at one end to the collector of the PNP transistor and at opposite end to the DC power supply means to receive a positive potential direct voltage signal;
whereby the transistor is rendered conductive and the relay is energized whenever the switching amplifier output signal is switched to the second, positive polarity, direct voltage level, and the transistor is rendered non-conductive and the relay is de-energized whenever the switching amplifier output signal is switched to its second, negative polarity, direct voltage level.

19. Switchgear apparatus for a high voltage alternating electric system which includes a grounded support structure and at least one encapsulated, single phase, circuit interrupter assembly which is affixed to the grounded support structure, and which comprises:
a vacuum interrupter having a fixed contact rod extending through one end of a vacuum enclosure and a movable contact rod extending through an opposite end of the vacuum enclosure, the movable contact rod being movable along its axis between an open position and a closed position, adjacent ends of the fixed contact rod and the movable contact rod carrying respective contacts which abut against each other when the movable contact rod is disposed in its closed position, and which are separated by a suitable distance when the movable contact rod is disposed in its open position;
a first connector stud, having one end attached to the fixed contact rod and an opposite end;
a second connector stud, having one end which carries a current exchange assembly in sliding contact with the movable contact rod, and an opposite end;
an interrupter housing of cast, electrically insulating material which includes
a central portion cast about the vacuum interrupter and defining an opening through which the movable contact rod extends,
a first end portion extending from the central portion and cast about the first connector stud, having a free end through which the opposite end of the first connector stud extends, the free end of the first end portion defining a first receiving bushing member, and
a second end portion extending from the central portion and cast about the second connector stud, having a free end through which the opposite end of the second connector stud extends, the free end of the second end portion defining a second receiving bushing member;
a first conductive coating, which is applied to the outer surface of the interrupter housing intermediate the first and second receiving bushing members, and which defines an uncoated window area, or opening in the first conductive coating, on the outer surface of one of the two end portions of the interrupter housing;
a mounting means for affixing the interrupter housing to the grounded support structure and electrically connecting the first conductive coating to the grounded support structure;
an annular-shaped second housing of cast electrically insulating material, having an inner peripheral surface extending about the one end portion of the interrupter housing over the uncoated window area thereof, and external side and outer peripheral surfaces, the second housing being affixed to the interrupter housing by electrically insulating material which is cast between the inner peripheral surface of the second housing and the outer surface of the interrupter housing to completely fill the space therebetween and form a single switchgear housing;
a current transformer embedded within the second housing, having an annular-shaped core of magnetic material which encircles the connector stud embedded within the one end portion of the interrupter housing, a secondary winding which is wound about the magnetic core, and two insulated conductor leads having first ends connected to respective ends of the secondary winding and second ends which extend outside of the second housing;

a voltage sensing plate, positioned adjacent the uncoated window area of the one end portion of interrupter housing, which defines, with the connector stud embedded within the one end portion of the interrupter housing, a first capacitor wherein the cast electrically insulating material between the voltage sensing plate and the connector stud embedded in the one end portion of the interrupter housing is a dielectric of the first capacitor;

a conductive member, having a first end which is embedded in the second housing and a second end which extends through an external surface of the second housing;

a second capacitor, embedded within the second housing, having a first side connected to the voltage sensing plate and an opposite second side connected to the conductive member, the second capacitor having a low impedance relative to the impedance of the first capacitor;

a coaxial lead, which includes a center conductor and an outer conductive shield, each having corresponding first ends and opposite second ends, the first end of the center conductor being connected to the first side of the second capacitor, and the first end of the outer shield being connected to second side of the second capacitor, the coaxial lead extending outside of the second housing through an external surface of the second housing;

a second conductive coating, applied to the external surfaces of the second housing and to the adjacent coated surfaces of the one end portion of the interrupter housing, and to the externally extending second end of the conductive member, wherein the first and second conductive coating define a resistive current path between the conductive member and ground which has a low impedance relative to the impedance of the first capacitor, and the first capacitor, the second capacitor, and the resistive current path are connected in series between one phase of the alternating electric system and ground;

whereby, because of the low impedance of the second capacitor and the resistive current path, both sides of the second capacitor are maintained at a low voltage, and the voltage across the second capacitor is proportional to the one phase-to-ground voltage of the alternating electric system.

20. Switchgear apparatus, as described in claim 19 wherein said at least one encapsulated single phase circuit interrupter assembly further comprises:

a thermistor which is embedded in the cast electrically insulating material in close proximity to a central portion of the voltage sensing plate and which is connected across the second capacitor; and a resistor, which is embedded in the cast electrical insulating material and connected across the second capacitor;

whereby the thermistor and resistor serve as a temperature compensating network to compensate for temperature-induced changes in the dielectric properties of the cast electrical insulating material disposed between the voltage sensing plate and the connector stud embedded in the one end portion of the interrupter housing.

21. Switchgear apparatus, as described in claim 19, wherein the conductive member is a metal tube through which the coaxial lead and the two insulated conductor leads extend.

22. Switchgear apparatus, as described in claim 19, wherein said at least one encapsulated single phase circuit interrupter assembly further comprises:

amplifier means having an output, a first input connected to the second end of the center conductor of the coaxial lead, and a second input connected to the second end of the outer shield of the coaxial lead and to ground, for producing at the amplifier output an alternating signal proportional to one phase-to-ground voltage of the alternating electric system, wherein the connection between the second end of the outer shield of the coaxial lead and ground has a low impedance relative to the impedance of the resistive current path defined by the first and second conductive coatings between the first end of the outer shield of the coaxial lead and ground.

23. Switchgear apparatus, as described in claim 22, which further comprises a DC power supply means for supplying at least one constant level, direct voltage reference signal, and wherein said at least one encapsulated single phase circuit interrupter assembly further comprises:

full wave rectifier means, having an output and an input which is connected to receive the alternating output signal produced by the amplifier means, for producing at its output a positive polarity direct voltage signal proportional to an absolute value of one phase-to-ground voltage of the alternating power system; and signal comparator means with hysteresis, having an output, a non-inverting input, an input resistor connected between the signal comparator non-inverting input and the output of the fullwave rectifier means, a feedback resistor connected between the signal comparator non-inverting input and the signal comparator output, and an inverting input connected to receive a first, positive polarity, constant level, direct voltage reference signal from the DC power supply means, for producing and switching an output signal between a first negative polarity direct voltage level and a first positive polarity direct voltage level, wherein the signal comparator output signal is switched from the first negative polarity direct voltage level to the first positive polarity direct voltage level whenever the phase-to-ground voltage of the alternating electric system exceeds a first predetermined value, and thereafter the signal comparator output signal is switched from the first positive polarity voltage level to the first negative polarity voltage level whenever the phase-to-ground voltage of the alternating electric system decreases to less than a second predetermined value which is less than the first predetermined value of the phase-to-ground voltage, wherein the difference between the first and second predetermined values is inversely proportional to the feedback resistor.

24. Switchgear apparatus, as described in claim 23, wherein the alternating electric system is a three phase system, said at least one encapsulated single phase circuit interrupter assembly includes first, second, and third encapsulated single phase circuit interrupter assemblies, coupled respectively to the three phases of the alternating power system and the switchgear apparatus further comprises:

a switching amplifier means, having an output, a non-inverting input, and an inverting input connected to receive from the DC power supply means a second, positive polarity direct voltage reference signal which is less than the first positive polarity, direct voltage level of the signal comparator output signals of the single phase voltage sensing circuits, for producing and switching an output signal between a second negative polarity direct voltage level and a second positive, polarity direct voltage level, wherein the switching amplifier output signal is switched from the second negative polarity direct voltage level to the second positive polarity direct voltage level whenever the voltage at the switching amplifier non-inverting input rises above the second, positive polarity, constant level, direct voltage reference signal supplied to the switching amplifier inverting input, and the switching amplifier output signal is switched from the second, positive polarity, direct voltage level to the second, negative polarity, direct voltage level whenever the voltage at the switching amplifier non-inverting input falls below the second, positive polarity, constant level, direct voltage reference signal supplied to the switching amplifier inverting input;

first, second, and third diodes connected between the switching amplifier non-inverting input and the signal comparator outputs of the first, second and third single phase voltage sensing circuits, respectively, to block current flow from any signal comparator output of the single phase voltage sensing circuits to the switching amplifier non-inverting input, and to allow current flow from the switching amplifier non-inverting input to any signal comparator output of the single phase voltage sensing circuits; and a voltage divider circuit which includes a first resistor connected between the switching amplifier non-inverting input and the DC power supply means to receive a third positive polarity, constant level, direct voltage reference signal and a second resistor connected between the switching amplifier non-inverting input and ground, the third, positive polarity, constant level, direct voltage reference signal and the first and second resistors being selected so that when the three signal comparator output signals of the single phase voltage sensing circuits have been switched to the first positive polarity direct voltage level, a positive polarity direct voltage signal, which is intermediate the first, positive polarity voltage level of the signal comparator output signals and the second positive polarity direct voltage reference signal supplied to the switching amplifier inverting input, is supplied to the switching amplifier non-inverting input, and when at least one signal comparator output signal has been switched to its first negative polarity voltage level, the positive polarity direct voltage signal supplied to the switching amplifier non-inverting input decreases to a voltage level which is less than the second positive polarity, constant level, direct voltage reference signal supplied to the switching amplifier inverting input;

whereby, the switching amplifier output signal is switched from the second, negative polarity, direct voltage level to the second, positive polarity, direct voltage level only when all three of the phase-to-ground voltages of the alternating power system exceeds the first predetermined value, and the switching amplifier output signal is thereafter switched back to the second, negative polarity, direct voltage level when any of the three-phase-to-ground voltages of the alternating electric system falls below the second predetermined value.

25. Switchgear apparatus, as described in claim 24, which further comprises:

switching means, disposed between the switching amplifier non-inverting input, the voltage divider first resistor, and the first, second and third diodes, which is movable a between a first position and a second position, wherein the voltage divider first resistor is connected between the DC power supply means and the switching amplifier non-inverting input, and the first, second and third diodes are connected between the switching amplifier non-inverting input and the signal comparator outputs of the first, second and third single phase voltage sensing circuits, respectively, when the switching means is disposed in the first position, and the switching amplifier non-inverting input is disconnected from the voltage divider first resistor and the first, second and third diodes when the switching means is disposed in its second position; and forth, fifth, and sixth diodes connected between the switching means and the signal comparator outputs of the first, second and third single phase voltage sensing circuits respectively, in opposite manner to the first, second and third diodes, wherein the fourth, fifth and sixth diodes are connected to the switching amplifier non-inverting input to allow current flow from any signal comparator output to the switching amplifier non-inverting input and to block current flow from the switching amplifier non-inverting input to any signal comparator output when the switching means is disposed in its second position, and the fourth, fifth, and sixth diodes are disconnected from the switching amplifier non-inverting input when the switching means is disposed in its first position;

whereby, when the switching means is disposed in its first position, the switching amplifier output signal is switched from the second, negative polarity, direct voltage level to the second, positive, direct voltage level only when all three phase-to-ground voltages of the alternating electric system exceeds the first predetermined value, and thereafter is switched back to the second, negative polarity, direct voltage level when any of the three phase-to-ground voltages of the alternating electric system falls below the second predetermined level, and, when the switching means is disposed in its second position, the switching amplifier output signal is switched from the second, negative polarity, direct voltage level to the second, positive polarity, direct voltage level whenever at least one phase-to-ground voltage of the alternating electric system exeeds the first predetermined value, and thereafter is switched back to the second, negative polarity, direct voltage level when said at least one phase-toground voltage falls below the second predetermined value.

26. Switchgear apparatus, as described in claim 25, which further comprises:
 a PNP transistor, having a collector, an emitter connected to ground, and a base connected to receive the switching amplifier output signal; and
 a relay, having an operating coil which is connected at one end to the collector of the PNP transistor and at opposite end to the DC power supply means to receive a positive potential direct voltage signal;
 whereby the transistor is rendered conductive and the relay is energized whenever the switching amplifier output signal is switched to the second, positive polarity, direct voltage level, and the transistor is rendered non-conductive and the relay is de-energized whenever the switching amplifier output signal is switched to its second, negative polarity, direct voltage level.

* * * * *

UNITED STATES PATENT AND TRADEMARK OFFICE
CERTIFICATE OF CORRECTION

PATENT NO. : 4,241,373

DATED : December 23, 1980

INVENTOR(S) : Mara et al

It is certified that error appears in the above-identified patent and that said Letters Patent are hereby corrected as shown below:

Column 4, line 45 the word "in" should be -- is --. Column 9, line 28 after the word "operational" insert -- amplifier --. Column 12, line 30 the numeral "8" should be -- 7 --; line 49 the abbreviation "PNP" should be -- NPN --. Column 13, line 16 the numeral "8" should be -- 7 --. Claim 7, Column 19, line 46 the abbreviation "PNP" should be -- NPN --; line 50 the abbreviation "PNP" should be -- NPN --; line 51 after the word "at" insert the word -- the --. Claim 9, Column 20, line 13 the word "grouned" should be -- grounded --. Claim 14, Column 22, line 61 the word "ininterrupter" should be -- interrupter --. Claim 17, Column 25, line 15 the word "forth" should be -- fourth --. Claim 18, Column 25, line 56 the abbreviation "PNP" should be -- NPN --; line 60 the abbreviation "PNP" should be -- NPN --; line 61 after the word "at" insert the word -- the --. Claim 25 Column 30, line 19 after the word "movable" the word "a" should be deleted; line 33 the word "forth" should be -- fourth --. Claim 26, Column 31, line 6 the abbreviation "PNP" should be -- NPN --; line 11 the abbreviation "PNP" should be -- NPN --; Column 32 line 1 after the word "at" insert the word -- the --.

Signed and Sealed this

Fifth Day of May 1981

[SEAL]

Attest:

RENE D. TEGTMEYER

Attesting Officer   Acting Commissioner of Patents and Trademarks